(12) United States Patent
Nishiyama et al.

(10) Patent No.: US 8,441,022 B2
(45) Date of Patent: May 14, 2013

(54) SEMICONDUCTOR LIGHT-EMITTING DEVICE

(75) Inventors: Nobuhiro Nishiyama, Osaka (JP); Masaaki Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 13 days.

(21) Appl. No.: 13/112,405

(22) Filed: May 20, 2011

(65) Prior Publication Data
US 2011/0284888 A1 Nov. 24, 2011

(30) Foreign Application Priority Data
May 21, 2010 (JP) .................... 2010-117807

(51) Int. Cl.
*H01L 33/38* (2010.01)
(52) U.S. Cl.
USPC .............. 257/91; 257/666; 257/676; 257/98; 257/E33.065; 438/22; 438/25
(58) Field of Classification Search .............. 257/91, 257/666, 676, E33.065, 98, 99; 438/22, 25
See application file for complete search history.

(56) References Cited

U.S. PATENT DOCUMENTS

| 7,183,588 | B2 * | 2/2007 | Chia et al. ................ 257/99 |
| 2004/0256706 | A1 * | 12/2004 | Nakashima ............. 257/678 |
| 2005/0280017 | A1 * | 12/2005 | Oshio et al. ............ 257/99 |
| 2007/0026574 | A1 * | 2/2007 | Beatson et al. ......... 438/123 |
| 2007/0295975 | A1 * | 12/2007 | Omae .................. 257/89 |
| 2008/0048201 | A1 | 2/2008 | Kim et al. |
| 2009/0189174 | A1 * | 7/2009 | Lee et al. ............... 257/99 |
| 2010/0277054 | A1 * | 11/2010 | Takashima et al. ..... 313/483 |

FOREIGN PATENT DOCUMENTS

| JP | 2006-24794 | 1/2006 |
| JP | 2008-53726 | 3/2008 |
| JP | 2009-9956 | 1/2009 |
| JP | 2011-035306 | 2/2011 |

* cited by examiner

*Primary Examiner* — Thinh T Nguyen
(74) *Attorney, Agent, or Firm* — Nixon & Vanderhye P.C.

(57) ABSTRACT

An outer lead connected to an inner lead penetrating a molded resin section, and another outer lead connected to another inner lead penetrating the molded resin section are provided on an outer wall surface of the molded resin section. The outer lead has a surface area greater than that of the another outer lead.

12 Claims, 5 Drawing Sheets

(a)

(b)

(a)

(b)

(c)

(a)

(b)

US 8,441,022 B2

SEMICONDUCTOR LIGHT-EMITTING DEVICE

This Nonprovisional application claims priority under 35 U.S.C. §119(a) on Patent Application No. 2010-117807 filed in Japan on May 21, 2010, the entire contents of which are hereby incorporated by reference.

TECHNICAL FIELD

The technology presented herein relates to a semiconductor light-emitting device employing a light emitting diode or the like.

BACKGROUND ART

Generally, a light-emitting device that employs a light-emitting diode chip is arranged by incorporating the light-emitting diode chip in various shaped packages in accordance with how the light-emitting device is to be employed.

Patent Literature 1, as a conventional art, discloses a package for a semiconductor light-emitting device that increases release of heat emitted from a semiconductor light-emitting element and suppresses deterioration in luminance of a semiconductor light-emitting element.

FIG. 6 is a view of Patent Literature 1 which view corresponds to FIG. 1. A semiconductor light-emitting device package 110 shown in FIG. 6 is arranged such that a first lead section 130 is exposed to an outside of a resin part of the semiconductor light-emitting device package 110 in such a manner that the first lead section 130 is extended and exposed continuously from an opening end of a cup portion of the semiconductor light-emitting device package 110 over a principal surface of the semiconductor light-emitting device package 110 being constituted by a frame part of a housing section 140 for housing the semiconductor light-emitting element. The first lead section 130 and a second lead section 120 each are arranged such that a whole surface thereof is exposed to the outside of the resin part. This arrangement makes it possible to increase heat release from the lead sections thereby preventing deterioration in luminance of the semiconductor light-emitting element due to increase in temperature.

As with the invention disclosed in Patent Literature 1, Patent Literature 2 discloses a light-emitting device employing a full-color light emitting diode in which device a lead section is exposed to an outside of a package. The light-emitting device disclosed in Patent Literature 2 is arranged such that a frame terminal necessary for causing a tricolor LED chip to emit light is exposed to the outside from a side surface of the package and bended along the side surface and a part of a bottom surface of the package. Further, Patent Literature 3 discloses a light emitting diode package in which a first lead terminal 51 and a second lead terminal 53 each penetrate a side wall of a package 55 so that the first lead terminal 51 and the second lead terminal 53 are electrically connected to an external power supply.

CITATION LIST

Patent Literature

Patent Literature 1
Japanese Patent Application Publication Tokukai No. 2009-9956 A (Publication Date: Jan. 15, 2009)

Patent Literature 2
Japanese Patent Application Publication Tokukai No. 2006-24794 A (Publication Date: Jan. 26, 2006)
Patent Literature 3
Japanese Patent Application Publication Tokukai No. 2008-53726 A (Publication Date: Mar. 6, 2008)

SUMMARY OF INVENTION

Technical Problem

As described above, the semiconductor light-emitting device package 110 disclosed in Patent Literature 1 is arranged such that the first lead section 130 and the second lead section 120 each have a whole surface exposed to an outside of a resin part of the semiconductor light-emitting device package 110. This arrangement makes it possible to increase heat release from the lead sections thereby preventing deterioration in luminance of a semiconductor light-emitting element due to increase in temperature.

However, the area surface or volume of the respective first lead section 130 and second lead section 120 exposed to the outside of the resin part is not great enough to sufficiently release heat.

Further, the first lead section 130 is arranged so as to be successively exposed to the outside from an opening end of a housing section 140. This arrangement makes it complicate to manufacture the lead section thereby causing raise in cost for manufacturing the semiconductor light-emitting device package.

The present technology was made in view of the conventional problems, and a feature of the present technology is to provide a semiconductor light-emitting device that increases heat release while suppressing deterioration in luminance of a semiconductor light-emitting element, and raises reliability of the semiconductor light-emitting device at low cost.

In order to attain the above feature, a semiconductor light-emitting device of the present technology is a semiconductor light-emitting device, for emitting light to an outside, the semiconductor light-emitting device being mountable on a substrate, including: at least one semiconductor light-emitting element; a semiconductor element; a first lead frame including a first inner lead and a first outer lead connected to each other, the first inner lead having a surface on which the at least one semiconductor light-emitting element is provided, the first outer lead being connectable to a corresponding electrode of the substrate; a second lead frame including a second inner lead and a second outer lead connected to each other, the second inner lead having a surface on which the semiconductor element is provided, the second outer lead being connectable to a corresponding electrode of the substrate; and a fixing member for fixing the first lead frame and the second lead frame thereto, both the first outer lead connected to the first inner lead penetrating the fixing member and the second outer lead connected to the second inner lead penetrating the fixing member being provided on an outer wall surface of the fixing member, the first outer lead having a surface area greater than that of the second outer lead.

According to the technology, the surface area of the first outer lead connected to the first inner lead having the surface on which the at least one semiconductor light-emitting element is provided is greater than that of another outer lead such as the second outer lead.

Arranging the lead frame to have as great surface area as possible, in which lead frame the at least one semiconductor light-emitting element is provided, makes it possible to efficiently release heat generated due to light emitted from the at least one semiconductor light-emitting element, the head causing increase in temperature (to transfer the heat from the first outer lead to solder or the like present on the substrate). It is accordingly possible to prevent color change, deterioration and the like due to heat of a package, over the semiconductor light-emitting device in which the at least one semiconductor light emitting element is provided.

Further, increase in heat release of the semiconductor light-emitting device makes it possible to raise reliability of the semiconductor light-emitting device. Further, it is unnecessary to provide special components in the semiconductor light-emitting device in order to increase heat release. It is therefore possible to raise reliability of the device at low cost.

Further, suppressing increase in temperature of the at least one semiconductor light-emitting element allows driving current for the at least one semiconductor light-emitting element to be increased.

The first outer lead is formed at a shortest distance from a region (concave portion) where the at least one semiconductor light-emitting element is provided. It is therefore possible to transfer, from the first outer lead via the shorted distance, the heat generated due to the light emitted from the at least one semiconductor light-emitting element. This makes it possible to suppress increase in temperature of the semiconductor light-emitting device.

In a case where the semiconductor light-emitting device is provided with a plurality of semiconductor light-emitting elements, the semiconductor light-emitting elements are provided in the semiconductor light-emitting device such that at least one of the semiconductor light-emitting elements provided in the concave portion is positioned close to the first outer lead. This leads to increase in heat release.

The semiconductor element is provided on the second inner lead in the fixing member (cavity, for example a molded resin section), and positioned at a level higher than that at which the at least one semiconductor light-emitting element provided in the concave portion is positioned.

Further, as described above, the at least one semiconductor light-emitting element is provided in the concave portion. This causes the light emitted from the at least one semiconductor light-emitting element to reflect off the outer wall (sidewall) of the fixing member in a direction in which the semiconductor light-emitting device emits light. This makes it hard for the light to reach the semiconductor element provided on the second inner lead. It is accordingly possible to suppress the semiconductor element to absorb the light thereby suppressing deterioration in luminance of light emitted from the semiconductor light-emitting device.

In this manner, the semiconductor light-emitting device of the present technology increases heat release while suppressing deterioration in luminance of the at least one semiconductor light-emitting element, and raises reliability of the semiconductor light-emitting device at low cost.

As described above, a semiconductor light-emitting device of the present technology is arranged such that both a first outer lead connected to a first inner lead penetrating a fixing member and a second outer lead connected to a second inner lead penetrating the fixing member are provided on an outer wall surface of the fixing member, and the first outer lead has a surface area greater than that of the second outer lead.

On this account, this makes it possible to provide a semiconductor light-emitting device, which is improved to have a higher heat release without sacrificing luminance of a semiconductor light-emitting element, and attains a high reliability at low cost.

DESCRIPTION OF EMBODIMENTS

First Embodiment

Figure 1:
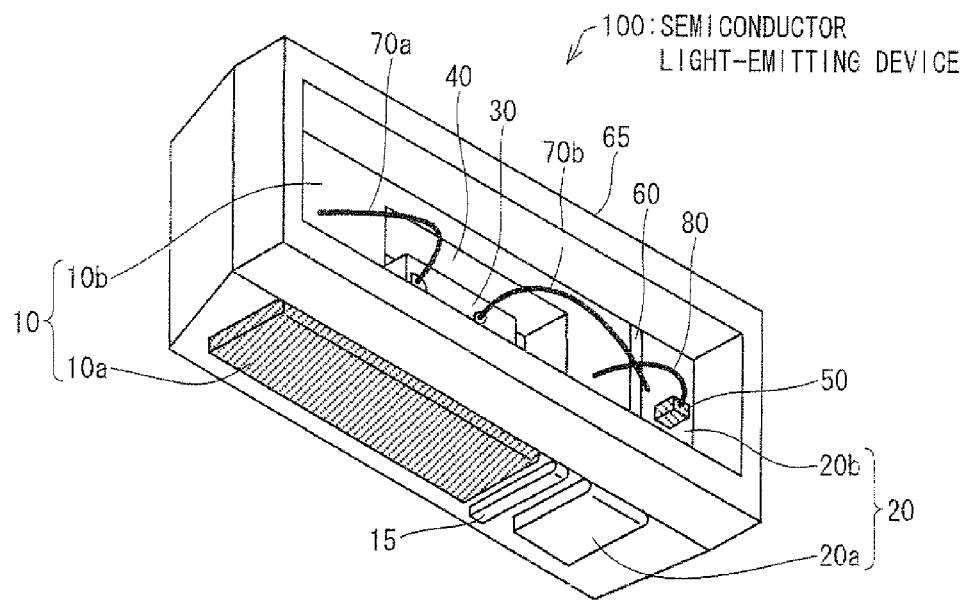
FIG. 1(a) and FIG. 1(b) are a perspective view and an elevation view, respectively, each of which schematically showing a semiconductor light-emitting device in accordance with a First Embodiment.
Figure 1:
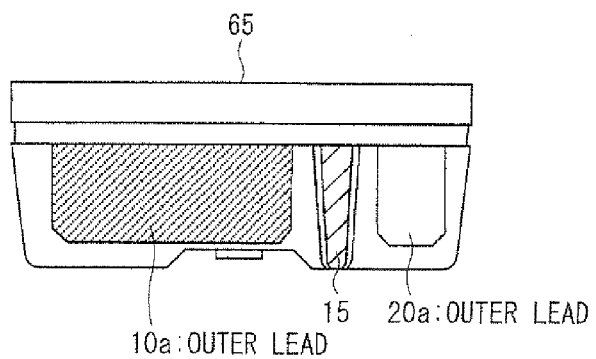
Figure 2:
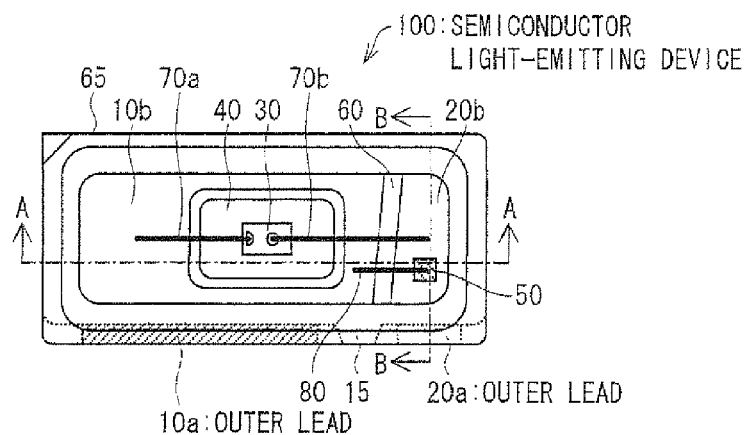
FIG. 2(a) is a plan view of the semiconductor light-emitting device in accordance with First Embodiment of the present invention.
FIG. 2(b) and FIG. 2(c) are cross-sectional views of the semiconductor light-emitting device in accordance with a First Embodiment.
Figure 2:
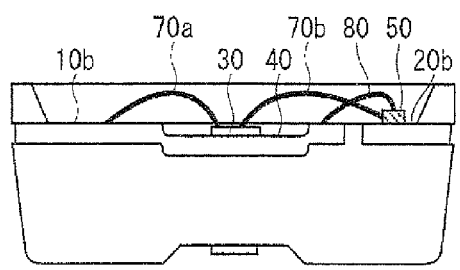
Figure 2:
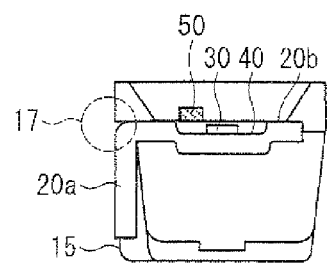

The following describes a First Embodiment with reference to FIGS. 1 and 2. First Embodiment describes a surface-mounted semiconductor light-emitting device that employs an LED (light emitting diode) as a light emitting element. FIG. 1(a) is a perspective view of a semiconductor light-emitting device 100 in accordance with the present embodiment. FIG. 1(b) is an elevation view of the semiconductor light-emitting device 100. FIG. 2(a) is a plan view of the semiconductor light-emitting device 100. FIG. 2(b) is a cross-sectional view of the semiconductor light-emitting device 100 taken along A-A line. FIG. 2(c) is a cross-sectional view of the semiconductor light-emitting device 100 taken along B-B line.

The semiconductor light-emitting device 100 is mountable on a substrate and emits light to an outside. In the semiconductor light-emitting device 100, a first lead frame 10 includes an outer lead 10a (first outer lead) and an inner lead 10b (first inner lead) connected to each other, and a second lead frame 20 includes an outer lead 20a (second outer lead) and an inner lead 20b (second inner lead) connected to each other.

The semiconductor light-emitting device 100 is arranged to have the long-side length of 5.0 mm, the height of 2.0 mm, and the short-side length of 2.3 mm. Further, the outer lead 10a of the first lead frame 10 and a convex member 15 are provided along an outer wall surface of the after-mentioned molded resin section 65 (fixing member). The outer lead 10a has the long-side length of 2.65 mm, and the height of 1.1 mm. The convex member 15 has the short-side length of 0.5 mm.

The first lead frame 10 including the outer leads 10a, and the second lead frame 20 including the outer lead 20a are formed so as to be inserted in the molded resin section made of a conventional sealing material such, as polyphthalamide (PPA), polycarbonate resin or epoxy resin for sealing a semiconductor element, so that the first lead frame 10 and the second lead frame 20 are protected by the molded resin section 65. An LED 30 (semiconductor light-emitting element, having the long-side length of 0.7 mm and the short-side length of 0.29 mm) is provided in a concave portion 40 of the inner lead 10b. The LED 30 is fixed to the inner lead 10b by use of silicon resin. The concave portion 40 has the long-side length of 1.5 mm, the short-side length of 0.9 mm, and the depth of 0.2 mm.

Further, a zener diode 50 (semiconductor element) is provided on the inner lead 20b. The zener diode 50 is electrically connected to the inner lead 20b by use of silver paste. The zener diode 50 is not only provided on the inner lead 20b in the molded resin section 65 (cavity) but also positioned at a level higher than a level at which the LED 30 provided in the concave portion 40 is positioned.

Further, a molded resin layer 60 (insulating layer) made of an insulating resin is formed so that the inner lead 10b is electrically insulated from the inner lead 20b. The molded resin layer 60 may be integrated with the molded resin section 65 (fixing member). Further, the molded resin layer 60 is not necessarily made of the insulating resin, may alternatively be formed by embedding an insulating member such as ceramic therein.

Further, in order to easily provide the zener diode 50 on the inner lead 20b, the molded resin layer 60 made of the insulating resin is formed obliquely to the short side of the semiconductor light-emitting device 100. Further, the zener diode 50 is provided on a broader surface of the inner lead 20b. This makes it easy to provide the zener diode 50 on the inner lead 20b.

Further, the first lead frame 10 and the second lead frame 20 are fixed by the molded resin section 65 made of a white resin.

The concave portion 40 is filled up with a fluorescent light-transmitting resin, and a light-transmitting resin is formed over the concave portion 40 which is filled up with the fluorescent light-transmitting resin. Alternatively, the concave portion 40 is filled up with the fluorescent light-transmitting resin, and another fluorescent light-transmitting resin may further be formed over the concave portion 40 which is filled up with the fluorescent light-transmitting resin.

The light-transmitting resin is epoxy resin or silicon resin.

It is apparent from FIG. 1(a) that the volume of the outer lead 10a connected to the inner lead 10b in which the LED 30 is provided is greater than that of the outer lead 20a (the long side of the outer lead 10a is longer than that of the outer lead 20a). That is, it is apparent that the long side of the outer lead 20a is shorter than that of the outer lead 10a.

This is also apparent from dimensions of both the outer lead 10a and the outer lead 20a provided along the outer wall surface of the molded resin section 65. As described above, the outer lead 10a of the first lead frame 10 has the long-side length of 2.65 mm and the height of 1.1 mm. The outer lead 20a of the second lead frame 20 has the long-side length of 0.7 mm and the height of 1.1 mm.

The above-described dimensions are merely an example of the present embodiment. The semiconductor light-emitting device 100 of the present embodiment is configured such that the long side of the outer lead 10a is longer than that of the outer lead 20a.

<Cross-Sectional View Taken Along A-A Line>

As shown in FIG. 2(b) that is a cross-sectional view of FIG. 2(a) taken along A-A line, the semiconductor light-emitting device 100 is provided with the inner lead 10b and the inner lead 20b. The zener diode 50 is provided on the inner lead 20b, and a wire 80 is bonded to a place of the inner lead 10b which place is other than the concave portion 40. The inner lead 10b has the concave portion 40 formed therein, and the LED 30 is provided in the concave portion 40.

The LED 30 has two terminals. One of the terminals is electrically bonded to the inner lead 10b by use of a wire 70a so that the LED 30 is connected to the outer lead 10a. The other of the terminals is electrically bonded to the inner lead 20b by use of a wire 70b so that the LED 30 is connected to the outer lead 20a.

<Cross-Sectional View Taken Along B-B Line>

As shown in FIG. 2(c) that is a cross-sectional view of FIG. 2(a) taken along B-B line, the semiconductor light-emitting device 100 is provided with the inner lead 10b and the inner lead 20b. The zener diode 50 is provided on the inner lead 20b. The inner lead 20b is connected to the outer lead 20a. The outer lead 10a of the first lead frame 10 penetrates the molded resin section 65 and is bended along the outer wall of the molded resin section 65. Further, the outer lead 20a of the second lead frame 20 penetrates the molded resin section 65 and is bended along the outer wall of the molded resin section 65.

Note that wires are not shown in FIG. 2(e) for the sake of easy explanation. Further, the inner lead 10b is connected to the outer lead 10a though this is not shown in FIG. 2(c).

<Heat Release>

As described above, it is apparent from FIG. 1(a) that the volume of the outer lead 10a connected to the inner lead 10b in which the LED 30 is provided is greater than that of the outer lead 20a (the long side of the outer lead 10a is longer than that of the outer lead 20a). That is, it is apparent that the long side of the outer lead 20a is shorter than that of the outer lead 10a.

In First Embodiment, the area surface of the outer lead 10a connected to the inner lead 10b in which the LED 30 is provided is broader than that of another outer lead in which the LED 30 is not provided. Arranging the lead frame 10 in which the LED 30 is provided so as to have as great volume as possible makes it possible to efficiently release heat generated due to light emitted from the LED 30, the heat causing increase in temperature (to transfer heat from the outer lead 10a to solder or the like present on a substrate). It is accordingly possible to prevent color change, deterioration and the like due to heat of a package, over the semiconductor light-emitting device 100.

Further, forming the concave portion 40 in the inner lead 10b allows the surface area of the inner lead 10b to be broadened. This leads to further increase in heat release. The inner lead 10b is configured to be connected to the outer lead 10a.

Further, increase in heat release of the semiconductor light-emitting device 100 leads to raise in reliability of the semiconductor light-emitting device 100. Further, it is unnecessary to provide special components in the semiconductor light-emitting device 100 in order to increase heat release. It is therefore possible to raise the reliability at low cost.

Further, as described above, the increase in temperature of the LED 30 can be suppressed. This allows driving current for the LED 30 to be increased.

The outer lead 10a corresponds to an outer lead having the volume or surface area greater than that of the outer lead 20a connected to the inner lead 20b in which the LED 30 is not provided.

The outer lead 10a is formed at a shortest distance from a region (concave portion 40) where the LED 30 is provided. It is therefore possible to release, from the outer lead 10a via the shortest distance, heat generated due to light emitted from the LED 30. This makes it possible to suppress increase in temperature of the semiconductor light-emitting device 100.

<Stability in Center of Gravity>

As described above, the long side of the outer lead 10a is longer than that of the outer lead 20a. Therefore, the semiconductor light-emitting device 100 is not unstably fixed to the substrate, so that for example, the semiconductor light-emitting device 100 does not incline. It is accordingly possible to stably mount the semiconductor light-emitting device 100 on the substrate. This makes it easy to axially align an optical axis of a light guide plate to that of the semiconductor light-emitting device 100 of the present embodiment thereby reducing misalignment of the optical axes. This also makes it possible to stabilize adhesiveness between the outer lead 10a and the solder or the like present on the substrate thereby adhering the outer lead 10a to the solder or the like present on the substrate with no inclination of the outer lead 10a and no space between the outer lead 10a and the solder. As a result, heat release can be further increased.

<Prevention of Short Circuit>

The semiconductor light-emitting device 100 is mounted on the substrate such that the outer lead 10a and the outer lead 20a are fixed and electrically connected to corresponding terminals of the substrate by use of, for example, soldering.

The convex member 15 prevents the outer lead 10a and the outer lead 20a from being shorted due to rise in soldering.

<Prevention of Climb-Up of Soldering>

In the semiconductor light-emitting device 100, the LED 30 is provided in the concave portion 40 of the inner lead 10b. Therefore, light extraction efficiency is increased by reducing the height of an upper part of the molded resin section 65 (height of the concave portion 40 from a surface on which the LED 30 in a chip form is provided). The reduction in height possibly allows soldering or the like to climb up the outer leads when the outer leads are fixed to an electrode land of the substrate. Particularly, the outer lead 10a has the greater surface area (longer long side) thereby leading to increase in amount of soldering. This further enhances a possibility that soldering climbs up the outer lead.

Meanwhile, according to the semiconductor light-emitting device 100 of First Embodiment, as shown in FIG. 2 (c), an overhang 17 is formed thereby preventing soldering or the like from climbing up.

The above-arranged semiconductor light-emitting device 100 of First Embodiment is provided with the first lead frame 10 arranged such that the light emitted from the LED 30 can be controlled by forming the concave portion 40 in the inner lead 10b (that is, deterioration in the resin constituting the molded resin section 65 is suppressed by allowing no light to reach the molded resin section 65), and heat release is increased by lengthening the long side of the outer lead 10a (increasing the volume of the outer lead 10a). Further, the semiconductor light-emitting device 100 of First Embodiment can also be stably mounted on the substrate.

Further, providing the LED 30 in the concave portion 40 causes the light emitted from the LED 30 to reflect off the outer wall (sidewall) of the molded resin section 65 so as to be emitted in a direction in which the semiconductor light-emitting device 100 emits light. This makes it hard for the light to reach the zener diode 50 provided on the inner lead 20b. It is accordingly possible to suppress the zener diode 50 to absorb the light thereby suppressing deterioration in luminance of the light emitted from the semiconductor light-emitting device 100.

<Ceramics>

Instead of employing the molded resin section 65 made of a sealing resin, a fixing member made of ceramics may be employed to fix the first lead frame 10 and the second lead frame 20 thereto, and the fixing member and the lead frames may be integrated with each other. The fixing member made of ceramics makes it possible to further increase heat release of the semiconductor light-emitting element (LED 30).

Further, it is preferable that the outer leads are coated with a metal having a solder wettability greater than that of a metal of which the outer leads are made. For example, in a case where the outer leads are made of copper (Cu), the outer leads are preferably coated with tin (Sn), gold (Au), silver (Ag) or tin bismuth alloy (SnBi).

Further, surfaces of terminals positioned on an outer wall of the molded resin section 65 which outer wall is a surface on which the substrate is provided are formed so as to be parallel to and leveled off with the outer wall, so that the semiconductor light-emitting device 100 is provided on a flat print substrate on which a wiring pattern is formed so as not to incline against the flat print substrate.

Second Embodiment

Figure 3:
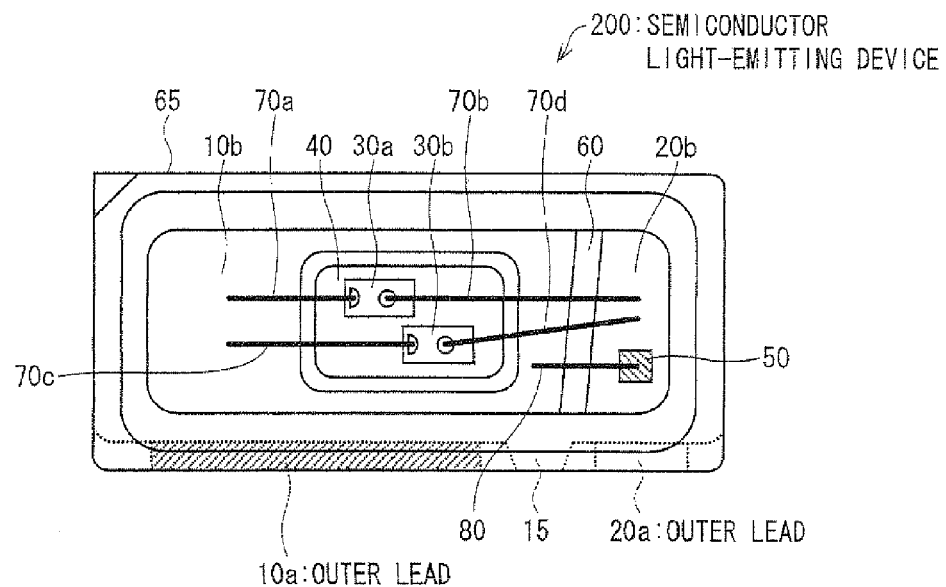
FIG. 3 is a plan view of a semiconductor light-emitting device in accordance with a Second Embodiment.

The following describes a Second Embodiment with reference to FIG. 3. Note that arrangements other than what is described in the present embodiment are identical to those of First Embodiment. Further, for the sake of easy explanation, like reference numerals herein refer to corresponding members having like functions in the drawings of First Embodiment, and descriptions of such members are omitted here.

A semiconductor light-emitting device 200 of Second Embodiment as shown in FIG. 3 is arranged in such a way that an LED 30a and an LED 30b are provided in the concave portion 40 of the inner lead 10b such that the long side of the LED 30a and the long side of the LED 30b are parallel to each other, and the long sides of the LEDs 30a and 30b are misaligned with (that is, not parallel to) the long side of the semiconductor light-emitting device 200. The LED 30a and the LED 30b (at least the two semiconductor light-emitting elements, each having the long-side length of 0.7 mm and the short-side length of 0.29 mm) are electrically connected in parallel to each other. Further, the zener diode 50 is positioned at a level higher than a level at which the LEDs 30a and 30b provided in the concave portion 40 are positioned.

The LED 30a has two terminals. One of the terminals is electrically bonded to the inner lead 10b via the wire 70a so as to be connected to the outer lead 10a. The other of the terminals is electrically bonded to the inner lead 20b via the wire 70b so as to be connected to the outer lead 20a.

The LED 30b also has two terminals. One of the terminals is electrically bonded to the inner lead 10b via a wire 70c so as to be connected to the outer lead 10a. The other of the terminals is electrically bonded to the inner lead 20b via a wire 70d so as to be connected to the outer lead 20a.

As described above, the LEDs 30a and 30b of Second Embodiment are provided in the concave portion 40. This causes light emitted from the LEDs 30a and 30b to reflect off the outer wall (sidewall) of the molded resin section 65 so as to be emitted in a direction in which the semiconductor light-emitting device 200 emits light. It is therefore possible to suppress deterioration in luminance of the light emitted from the semiconductor light-emitting device 200.

The outer lead 10a is formed at a shortest distance from a region (concave portion 40) where the LEDs 30a and 30b are provided. It is therefore possible to release, from the outer lead 10a via the shortest distance, heat generated due to the light emitted from the LEDs 30a and 30b. This makes it possible to suppress increase in temperature of the semiconductor light-emitting device 200.

In a case where a plurality of LEDs are provided in the semiconductor light-emitting device 200 as described above, the LEDs are provided such that at least one of the semiconductor light-emitting elements provided in the concave portion 40 is positioned close to the first outer lead 10a. This makes it possible to increase heat release.

Modified Second Embodiment

Figure 4:
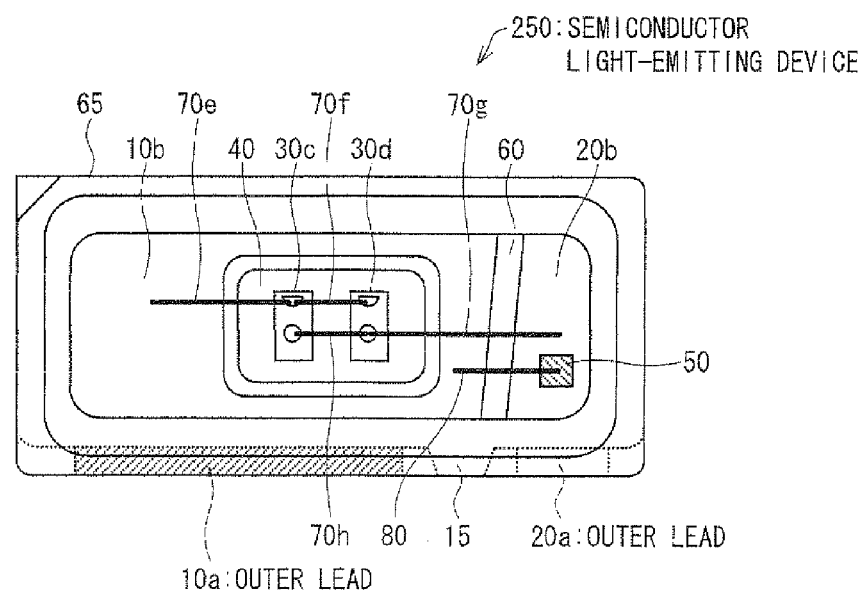
FIG. 4 is a plan view of a semiconductor light-emitting device obtained by modifying the semiconductor light-emitting device in accordance with a Second Embodiment.

The following describes a modified example of Second Embodiment with reference to FIG. 4. A semiconductor light-emitting device 250 of the modified example shown in FIG. 4 is arranged in such a manner that an LED 30c and an LED 30d are provided in the concave portion 40 of the inner lead 10b such that the long side of the LED 30c and the long side of the LED 30d are parallel to each other.

Further, the LED 30c has a P-type electrode and an N-type electrode. The LED 30c is provided such that the P-type electrode of the LED 30c is positioned closer to the outer lead 10a than the N-type electrode of the LED 30c is. Similarly, the LED 30d has a P-type electrode and an N-type electrode. The LED 30d is provided such that the P-type electrode of the LED 30d is positioned closer to the outer lead 10a than the N-type electrode of the LED 30d is. The LEDs 30c and 30d (each having the long side length of 0.7 mm and the short side length of 0.29 mm) are electrically connected in parallel to each other. Further, the zener diode 50 is positioned at a level higher than a level at which the LEDs 30c and 30d provided in the concave portion 40 are positioned.

The N-type electrode of the LED 30c is electrically bonded to the inner lead 10b via a wire 70e so as to be connected to the outer lead 10a. The N-type electrode of the LED 30d is electrically bonded to the N-type electrode of the LED 30c via a wire 70f so as to be connected to the outer lead 10a via the N-type electrode of the LED 30c and the inner lead 10b.

The P-type electrode of the LED 30d is electrically bonded to the inner lead 20b via a wire 70g so as to be connected to the outer lead 20a. The P-type electrode of the LED 30c is electrically bonded to the P-type electrode of the LED 30d via a wire 70h so as to be connected to the outer lead 20a via the P-type electrode of the LED 30d and the inner lead 20b.

As described above, the LEDs 30c and 30d of the modified example are provided in the concave portion 40. This causes light emitted from the LEDs 30c and 30d to reflect off the outer wall (sidewall) of the molded resin section 65 so as to be emitted in a direction in which the semiconductor light-emitting device 250 emits light. It is therefore possible to suppress deterioration in luminance of the light emitted from the semiconductor light-emitting device 250.

Further, the LEDs 30c and 30d of the semiconductor light-emitting device 250 of the modified example are provided such that the P-type electrodes of the LEDs 30c and 30d are positioned closer to the outer lead 10a than the N-type electrodes of the LEDs 30c and 30d are. This makes it possible to effectively release, from the outer lead 10a, heat generated due to the light emitted from the LEDs 30c and 30d (this is because the LEDs 30c and 30d each have a light-emitting layer, and sides of the LEDs 30c and 30d in which sides P layers and the light-emitting layers are positioned are approximated to the outer lead 10a).

Further, the outer lead 10a of the semiconductor light-emitting device 250 of the modified example is formed at a shortest distance from a region (concave portion 40) where the LEDs 30c and 30d are provided. It is therefore possible to release, from the outer lead 10a via the shortest distance, the heat generated due to the light emitted from the LEDs 30c and 30d. This makes it possible to suppress increase in temperature of the semiconductor light-emitting device 250.

The modified example and Second Embodiment describe a case where two LEDs are employed. Meanwhile, it goes without saying a case where three or more LEDs are employed.

Third Embodiment

Figure 5:
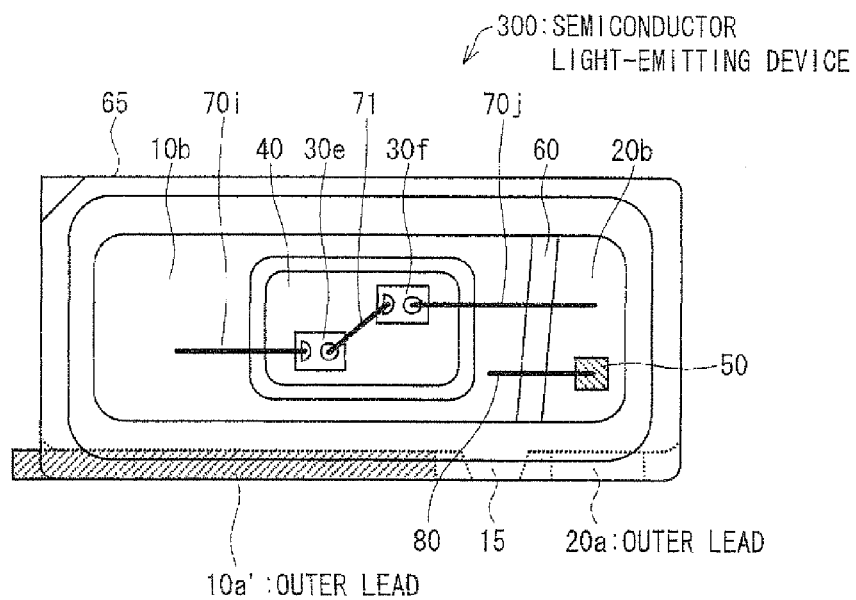
FIG. 5(a) and FIG. 5(b) are a plan view and an elevation view, respectively, each of which showing a semiconductor light-emitting device in accordance with a Third Embodiment.
Figure 5:
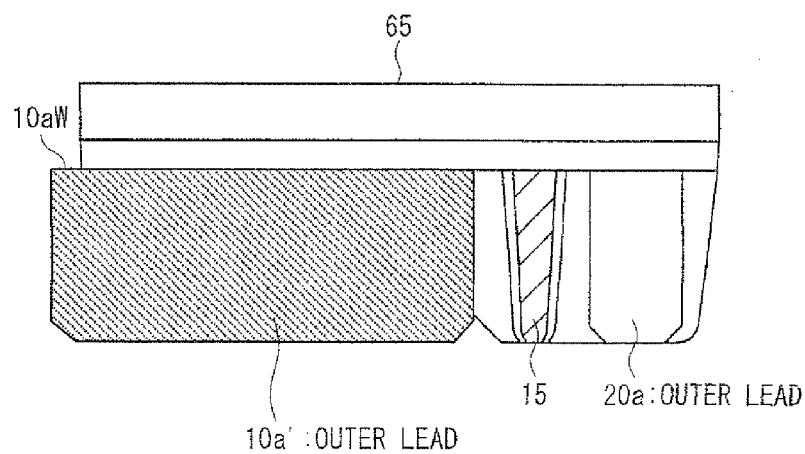
Figure 6:
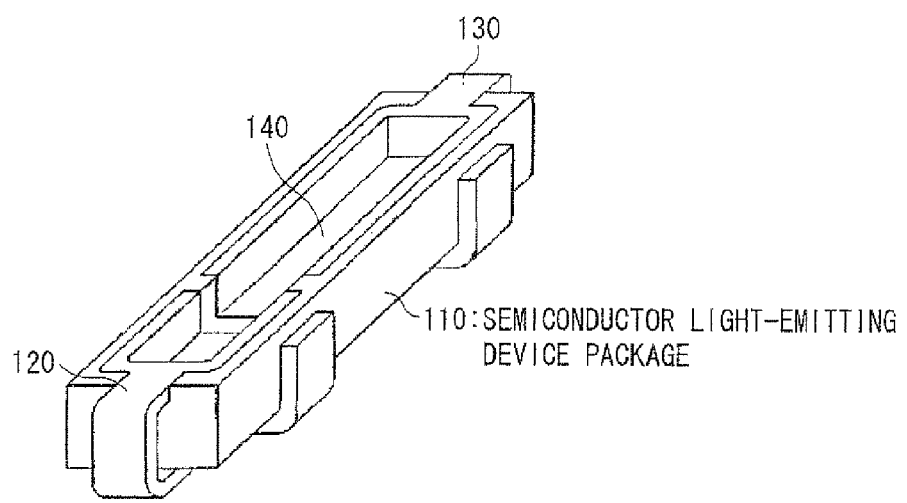
FIG. 6 is a view schematically showing a conventional semiconductor light-emitting device.

The following describes Third Embodiment with reference to FIGS. 5(a) and 5(b). Note that arrangements other than what is described in the present embodiment are identical to those of First and Second Embodiments. Further, for the sake of easy explanation, like reference numerals herein refer to corresponding members having like functions in the drawings of First and Second Embodiments, and descriptions of such members are omitted here.

A semiconductor light-emitting device 300 of Third Embodiment as shown in FIGS. 5(a) and 5(b) is arranged in such a manner that an LED 30e and an LED 30f each of which is cubic in shape are provided in the concave portion 40 of the inner lead 10b such that a side of the LED 30e and a side of the LED 30f are parallel to each other, and the sides of the LEDs 30e and 30f are misaligned with (that is, not parallel to) the long side of the semiconductor light-emitting device 300. The LED 30e and the LED 30f (each having the side length of 0.45 mm) are electrically connected in series with each other. The LED 30e and the LED 30f are also electrically connected to each other via a wire 71. Further, the zener diode 50 is positioned at a level higher than a level at which the LEDs 30e and 30f provided in the concave portion 40 are positioned.

The LED 30e and the LED 30f each have two terminals. One of the terminals of the LED 30e is electrically bonded to the inner lead 10b via a wire 70i so as to be connected to the outer lead 10a. The other of the terminals of the LED 30e is electrically connected to one of the terminals of the LED 30f via the wire 71. The other of the terminals of the LED 30f is electrically bonded to the inner lead 20b via a wire 70j so as to be connected to the outer lead 20a.

As described above, the LEDs 30e and 30f of Third Embodiment are provided in the concave portion 40. This causes light emitted from the LEDs 30e and 30f to reflect off the outer wall (sidewall) of the molded resin section 65 so as to be emitted in a direction in which the semiconductor light-emitting device 300 emits light. It is therefore possible to suppress deterioration in luminance of the light emitted from the semiconductor light-emitting device 300.

Further, the outer lead 10a' is formed at a shortest distance from a region (concave portion 40) where the LEDs 30e and 30f are provided. It is therefore possible to release, from the outer lead 10a' via the shortest distance, heat generated due to the light emitted from the LEDs 30e and 30f. This makes it possible to suppress increase in temperature of the semiconductor light-emitting device 300.

The semiconductor light-emitting device 300 shown in FIGS. 5(a) and 5(b) is arranged such that the outer lead 10a' which is connected to the inner lead 10b in which the LEDs 30e and 30f are provided and which is provided along the outer wall surface of the molded resin section 65 has a volume greater than that of the outer lead 10a (that is, the long-side length of the outer lead 10a' is longer than that of the outer lead 10a, and the height of the outer lead 10a' is greater than that of the outer lead 10a). Further, it is apparent from FIGS. 5(a) and 5(b) that the long-side length of the outer lead 20a is shorter than that of the outer lead 10a'.

The feature of the semiconductor light-emitting device 300 described above is apparent from FIG. 5(b) illustrating an exemplary configuration thereof in which the outer lead 10a' of the first lead frame 10 has the long-side length of 3.45 mm (including a projection portion 10aW) and the height of 1.3 mm, and the outer lead 20a of the second lead frame 20 has the long-side length of 0.7 mm and the height of 1.3 mm, the outer lead 10a' and the outer lead 20a being provided along the outer wall surface of the molded resin section 65.

The above-described dimension is merely an example of the present embodiment. The semiconductor light-emitting device 300 is configured such that the long-side length of the outer lead 10a' is longer than those of the outer leads 10a and 20a.

The outer lead 10a' of the first lead frame 10 may be formed so as to extend from the outer wall surface of the molded resin section 65 to an outside (so as to project from the outer wall surface of the molded resin section 65 to the outside). A portion of the outer lead 10a' which portion projects to the outside preferably has a projection length of not more than 0.6 mm. The length of the portion projecting to the outside is preferably not more than 0.6 mm in consideration of a positional relationship between the semiconductor light-emitting device 300 and a member adjacent to the semiconductor light-emitting device 300 in a case where the semiconductor light-emitting device 300 is mounted on the substrate.

The adjacent member may be another semiconductor light-emitting device 300. Alternatively, the adjacent member may be a semiconductor light-emitting device different from the semiconductor light-emitting device 300. In a case where the adjacent member is another semiconductor light-emitting device 300, the two semiconductor light-emitting devices 300 are mounted on the substrate so as to be adjacent to each other.

The outer lead 10a' of Third Embodiment has the long-side length and the height greater than those of the outer lead 10a. Therefore, heat release from the outer lead 10a' is further increased than that from the outer lead 10a. Further, the outer lead 10a' having the long-side length and the height greater than those of the outer lead 10a, and the outer lead 20a allow the semiconductor light-emitting device to be further stably fixed to the substrate.

The embodiments and concrete examples of implementation discussed in the foregoing detailed explanation serve solely to illustrate the technical details of the present technology, which should not be narrowly interpreted within the limits of such embodiments and concrete examples, but rather may be applied in many variations within the spirit of the present technology, provided such variations do not exceed the scope of the patent claims set forth below.

The present technology presented herein is not limited to the description of the embodiments above, but may be altered by a skilled person within the scope of the claims. An embodiment based on a proper combination of technical means disclosed in different embodiments is encompassed in the technical scope of the present technology.

A semiconductor light-emitting device of the present technology can increase heat release while suppressing deterioration in luminance of a semiconductor light-emitting element, and raise reliability of the device at low cost. Therefore, the semiconductor light-emitting device of the present technology is suitably applicable to a semiconductor light-emitting device provided with a semiconductor light-emitting element such as an LED.

REFERENCE SIGNS LIST

10: first lead frame
20: second lead frame
10a: outer lead (first outer lead)
10b: inner lead (first inner lead)
15: convex member
20a: outer lead (second outer lead)
20b: inner lead (second inner lead)
30, and 30a to 30f: LED (semiconductor light-emitting element)
50: zener diode (semiconductor element)
65: molded resin section (fixing member)

The invention claimed is:

1. A semiconductor light-emitting device, for emitting light to an outside, the semiconductor light-emitting device being mountable on a substrate,
the semiconductor light-emitting device comprising:
at least one semiconductor light-emitting element;
a semiconductor element;
a first lead frame including a first inner lead and a first outer lead connected to each other, the first inner lead having a surface on which the at least one semiconductor light-emitting element is provided, the first outer lead being connectable to a corresponding electrode of the substrate;
a second lead frame including a second inner lead and a second outer lead connected to each other, the second inner lead having a surface on which the semiconductor element is provided, the second outer lead being connectable to a corresponding electrode of the substrate; and
a fixing member for fixing the first lead frame and the second lead frame thereto,
both the first outer lead connected to the first inner lead penetrating the fixing member and the second outer lead connected to the second inner lead penetrating the fixing member being provided on an outer wall surface of the fixing member,
the first outer lead having a surface area greater than that of the second outer lead,
the device further comprising an insulating layer formed between the first inner lead and the second inner lead so as to be oblique to one side of the semiconductor light-emitting device,
the insulating layer being made of a material identical to that for the fixing member.

2. The semiconductor light-emitting device as set forth in claim 1, wherein the fixing member is made of a molded resin.

3. The semiconductor light-emitting device as set forth in claim 1, wherein the fixing member is made of ceramics.

4. The semiconductor light-emitting device as set forth in claim 1,
wherein the device is formed so as to have a rectangular shape, and
the insulating layer is formed oblique to a short side of the semiconductor light-emitting device.

5. The semiconductor light-emitting device as set forth in claim 1, wherein a convex member is formed on the outer wall surface of the fixing member between the first outer lead and the second outer lead.

6. The semiconductor light-emitting device as set forth in claim 1, wherein the first inner lead has a concave portion formed therein,
the at least one semiconductor light-emitting element is provided in the concave portion.

7. The semiconductor light-emitting device as set forth in claim 6, wherein the at least one semiconductor light-emitting element is at least two semiconductor light-emitting elements and the at least two semiconductor light-emitting elements provided in the concave portion are electrically connected in parallel or in series with each other, the semiconductor element is positioned at a level higher than that at which the at least two semiconductor light-emitting elements are positioned.

8. The semiconductor light-emitting device as set forth in claim 6, wherein the concave portion is filled up with a fluorescent light-transmitting resin, and a light-transmitting resin is formed over the concave portion which is filled up with the fluorescent light-transmitting resin.

9. The semiconductor light-emitting device as set forth in claim 6, wherein the concave portion is filled up with a fluorescent light-transmitting resin, and another fluorescent light-transmitting resin is further formed over the concave portion which is filled up with the fluorescent light-transmitting resin.

10. The semiconductor light-emitting device as set forth in claim 8, wherein the light-transmitting resin is made of an epoxy resin or silicon resin.

11. The semiconductor light-emitting device as set forth in claim 1, wherein the first outer lead and the second outer lead are coated with a metal having a solder wettability greater than that of a metal of which the first outer lead and the second outer lead are made.

12. The semiconductor light-emitting device as set forth in claim 11, wherein the first outer lead and the second outer lead are made of copper, the metal with which the first outer lead and the second outer lead are coated is tin, gold or silver.

\* \* \* \* \*